United States Patent
Baggenstoss

(10) Patent No.: US 6,811,934 B2
(45) Date of Patent: Nov. 2, 2004

(54) FIELD CORRECTION OF OVERLAY ERROR

(75) Inventor: Bill Baggenstoss, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/228,866

(22) Filed: Aug. 26, 2002

(65) Prior Publication Data

US 2003/0022075 A1 Jan. 30, 2003

Related U.S. Application Data

(62) Division of application No. 09/388,055, filed on Sep. 1, 1999, now Pat. No. 6,440,612.

(51) Int. Cl.$^7$ ................................................ G03F 9/00
(52) U.S. Cl. ........................................................ 430/5
(58) Field of Search ............................................ 430/5

(56) References Cited

U.S. PATENT DOCUMENTS

| | | | |
|---|---|---|---|
| 5,124,927 A | 6/1992 | Hopewell et al. ........... 364/468 |
| 5,300,786 A | 4/1994 | Brunner et al. | |
| 5,355,306 A | 10/1994 | Waldo | |
| 5,371,774 A | 12/1994 | Cerrina et al. | |
| 5,715,063 A | 2/1998 | Ota | |
| 5,795,688 A | 8/1998 | Burdorf et al. ............... 430/30 |
| 5,801,954 A | 9/1998 | Le et al. ..................... 364/488 |
| 5,838,450 A | 11/1998 | McCoy et al. | |
| 5,841,520 A | 11/1998 | Taniguchi | |
| 5,877,861 A | 3/1999 | Ausschnitt et al. ......... 356/401 |
| 5,885,734 A | 3/1999 | Pierrat et al. .................... 430/5 |
| 5,939,226 A | 8/1999 | Tomimatu | |
| 5,952,134 A | 9/1999 | Hwang ........................ 430/22 |
| 5,966,201 A | 10/1999 | Shiraishi et al. | |
| 5,978,085 A | 11/1999 | Smith et al. ................. 356/354 |
| 5,989,762 A | 11/1999 | Takaoka ....................... 430/30 |
| 6,011,611 A | 1/2000 | Nomura et al. | |
| 6,097,473 A | 8/2000 | Ota et al. ...................... 355/53 |
| 6,128,070 A | 10/2000 | Peng ............................ 355/53 |
| 6,165,656 A | 12/2000 | Tomimatu .................... 430/22 |
| 6,172,740 B1 | 1/2001 | Suzuki | |
| 6,238,851 B1 | 5/2001 | Nishi | |
| 6,333,776 B1 | 12/2001 | Taniguchi | |
| 6,356,343 B1 | 3/2002 | Shiraishi et al. .............. 355/77 |
| 6,396,569 B2 | 5/2002 | Zheng et al. ................. 355/77 |
| 6,407,396 B1 | 6/2002 | Mih et al. | |
| 6,429,930 B1 | 8/2002 | Littau et al. | |
| 6,432,591 B1 | 8/2002 | Baluswamy et al. .......... 430/22 |
| 6,436,595 B1 | 8/2002 | Credendino et al. .......... 430/22 |
| 6,440,612 B1 * | 8/2002 | Baggenstoss .................. 430/5 |

(List continued on next page.)

OTHER PUBLICATIONS

Preil, M..E. ,et al. ,"Minimization of Total Overlay Errors when Matching Non–Concentric Exposure Fields", *The International Society for Optical Engineering, 2197*, (1994), pp. 753–767.

Ausschnitt, Christopher P., et al., "Seeing the forest for the trees: a new approach to CD control", *SPIE, 3332*, 212–220, (1998).

Kim, Young C., "Automatic In–situ Focus Monitor Using Line Shortening Effect", *SPIE, 3677*, (1999), 184–193.

*Primary Examiner*—Saleha R. Mohamedulla
(74) *Attorney, Agent, or Firm*—Schwegman, Lundberg, Woessner & Kluth, P.A.

(57) ABSTRACT

Methods of correcting for overlay error, wherein the methods account for relative offset across the field of exposures of more than one photolithography projection system, as well as systems to perform the methods and apparatus produced therefrom. The methods include defining at least two zones within a field of a mask having substantially similar overlay error values. The methods further include modifying the coordinates of a feature of the mask in response to a correction for the zone to which the feature is mapped, where the correction corresponds to a nominal overlay error value for that zone.

41 Claims, 9 Drawing Sheets

U.S. PATENT DOCUMENTS

| | | |
|---|---|---|
| 6,453,457 B1 | 9/2002 | Pierrat et al. |
| 6,465,141 B2 | 10/2002 | Boettiger et al. |
| 6,486,956 B2 | 11/2002 | Byers et al. |
| 6,498,685 B1 | 12/2002 | Johnson |
| 6,523,162 B1 | 2/2003 | Agrawal et al. |
| 6,538,830 B2 | 3/2003 | Boettiger et al. |
| 6,539,521 B1 | 3/2003 | Pierrat |
| 6,545,829 B1 | 4/2003 | Boettiger et al. |
| 6,584,609 B1 | 6/2003 | Pierrat et al. |
| 6,606,152 B2 | 8/2003 | Littau et al. |
| 6,617,080 B1 | 9/2003 | Kawachi |
| 6,625,801 B1 | 9/2003 | Pierrat |
| 2001/0017693 A1 | 8/2001 | Zheng et al. ............... 355/77 |
| 2001/0055103 A1 | 12/2001 | Nishi |
| 2002/0041369 A1 | 4/2002 | Boettiger et al. |
| 2002/0041373 A1 | 4/2002 | Littau et al. |
| 2002/0070355 A1 | 6/2002 | Ota |
| 2002/0085297 A1 | 7/2002 | Boettiger et al. |
| 2002/0137237 A1 | 9/2002 | Byers |
| 2002/0137240 A1 | 9/2002 | Byers et al. |
| 2002/0137303 A1 | 9/2002 | Byers et al. |
| 2002/0182516 A1 | 12/2002 | Bowes |
| 2003/0002031 A1 | 1/2003 | Littau et al. |
| 2003/0002043 A1 | 1/2003 | Abdulhaim et al. |
| 2003/0021465 A1 | 1/2003 | Adel et al. |
| 2003/0021466 A1 | 1/2003 | Adel et al. |
| 2003/0021467 A1 | 1/2003 | Adel et al. |
| 2003/0026471 A1 | 2/2003 | Adel et al. |
| 2003/0035090 A1 | 2/2003 | Imai et al. |
| 2003/0081193 A1 | 5/2003 | White et al. |
| 2003/0087192 A1 | 5/2003 | Gau et al. |
| 2003/0090661 A1 | 5/2003 | Kobayaski |
| 2003/0095267 A1 | 5/2003 | Mieher et al. |
| 2003/0117599 A1 | 6/2003 | Takakuwa et al. |
| 2003/0152851 A1 | 8/2003 | Ideda |
| 2003/0156276 A1 | 8/2003 | Bowes |

\* cited by examiner

FIELD CORRECTION OF OVERLAY ERROR

This application is a Divisional of U.S. application Ser. No. 09/388,055, filed Sep. 1, 1999, now U.S. Pat. No. 6,440,612, which is incorporated herein by reference.

TECHNICAL FIELD OF THE INVENTION

The present invention relates generally to optical lithographic techniques commonly used in the formation of integrated circuits and structures on a semiconductor substrate. In particular, the present invention relates to methods of correcting a mask for use in photolithography, systems to perform the correction and apparatus produced from such a corrected mask.

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever. The following notice applies to the software and data as described below and in the drawings hereto: Copyright© 1999, Micron Technology, Inc., All Rights Reserved.

BACKGROUND OF THE INVENTION

Semiconductor device features are primarily fabricated using photolithography. The art of photolithography embodies techniques for creating two-dimensional patterns on a work surface, or target, by the controlled application of energy (such as electromagnetic, ion beam or other radiation) to a reactive material, or resist, deposited on the target. In a photolithographic process, the energy application is controlled through the use of a patterned photomask. The pattern is transferred to a resist coating on the target, forming a resist pattern. The target is then etched according to the resist pattern and, following the etch, subjected to further processing steps. In semiconductor fabrication, the target may be a semiconductor wafer and the resulting features form a portion of a final integrated circuit.

Typically, photolithography is achieved by projecting or transmitting energy through a pattern made of opaque areas and clear areas on a mask. In the case of optical photolithography, the opaque areas of the pattern block light, thereby casting shadows and creating dark areas, while the clear areas allow light to pass, thereby creating light areas. Energy is projected through the clear areas onto and through a lens and subsequently onto the target, such as a semiconductor wafer. The term opaque refers to any area that blocks a sufficient level of the projected energy such that any energy passing through the opaque area will produce only negligible reaction with the resist coating. The term clear refers to any area that permits a sufficient level of energy to project onto the target to react with the resist coating to produce a resist pattern. The resist pattern is used to protect portions of an underlying substrate during subsequent removal techniques, such as etching, to form a patterned layer on the substrate substantially duplicating the resist pattern.

In the process of forming a patterned layer through the use of a projection exposure, it is customary that a member used for reduced-size projection is termed a reticle, and a member for life-size projection is termed a mask; or a member corresponding to an original sheet is termed a reticle, and a member obtained by duplicating such a reticle is termed a mask. In the present invention, any of the masks and reticles classified by such various definitions are referred to as a mask for convenience. Furthermore, the term mask may also refer to a database representation used to produce a physical mask.

The process of producing a mask for an integrated circuit involves generating a composite drawing of the integrated circuit derived from a circuit layout, which is generated from the functional and schematic diagrams. The composite drawing represents the various layers of the integrated circuit, and each layer of the composite drawing will be used to generate a single mask. To transform a layer of the composite drawing into a mask, it is digitized. The resulting database representation defines the opaque and clear areas of the mask. The physical mask is typically produced by selectively establishing areas of opaque material, often a layer of chrome, on a clear support, often a glass or quartz plate. As will be apparent to the reader, areas of the clear support not covered by the opaque material are necessarily clear.

Because of increased semiconductor device complexity that results in increased pattern complexity, and increased pattern packing density on the mask, it is becoming increasingly difficult to produce a precise pattern image despite advances in photolithographic techniques. One problem leading to increased difficulty in transferring a pattern from a mask to the target is overlay error. Overlay error occurs where two discrete patterned layers are formed using masks on two separate lithography systems. Each lithography system will have a distortion fingerprint, i.e., imperfections in the lens and stepper mechanisms resulting in a translation or offset between the intended placement of an image feature and the actual placement of its projected image. Where one lithography system is used to produce a pattern on a first layer and a second lithography system is used to produce a pattern on a second layer, the differences in their distortion fingerprints result in a relative offset between corresponding features of the two patterns A common situation includes two lithography systems, with one having a larger field of exposure than the other. The exposure from the lithography system having the smaller field of exposure is reproduced usually two or more times in the field of exposure of the other lithography system. Another situation is simply where one exposure from one lithography system overlays an exposure from another lithography system.

Translation, rotation and magnification have been used to minimize overlay error. Despite such corrections for overlay error, features will still experience offset. This residual offset may be unacceptable as feature dimensions continue to decrease.

As can be seen, the accuracy of the mask pattern and the resulting resist pattern play important roles in the quality of the circuit. As feature size decreases, the impact of offset increases proportionately. As manufacturing requirements call for exposure of patterns with smaller and smaller dimensions, it is becoming necessary to employ techniques that permit enhancement of the current performance of the process of photolithography.

SUMMARY OF THE INVENTION

Methods are disclosed wherein a photolithographic mask is corrected based on overlay error values for various zones across a field. A variety of semiconductor circuits, dies, modules and electronic systems may be produced from masks produced in accordance with the invention. Such apparatus exhibit improved uniformity of features at the circuit level of the apparatus due to a decrease in overlay error not possible through conventional overlay error correction.

In one embodiment, the invention provides a method of correcting a photolithographic mask involving determining overlay error variation across a field of the mask and defining at least two zones within the field of the mask, wherein each zone is a continuous portion of the field containing substantially similar overlay error values, and wherein each zone has a nominal overlay error value. The method further includes defining a correction for each of the at least two zones, wherein the correction for each zone is approximately the nominal overlay error value for that zone, mapping a feature of the mask to one of the at least two zones, and modifying coordinates of the feature in response to the correction for the zone to which the feature is mapped. In a further embodiment, the invention provides photolithographic masks wherein features on the mask exhibit overlay error corrections based on zones within a field of the mask.

In another embodiment, the invention provides a method of producing a photolithographic mask involving generating a database representation of a physical mask, correcting the database representation for overlay error, and selectively establishing opaque areas on a clear support in response to the corrected database representation. Correcting for overlay error includes determining overlay error variation across a field of the mask and defining at least two zones within the field of the mask, wherein each zone is a continuous portion of the field containing substantially similar overlay error values, and wherein each zone has a nominal overlay error value. Correcting for overlay error further includes defining a correction for each of the at least two zones, wherein the correction for each zone is approximately the nominal overlay error value for that zone, mapping each of a plurality of features to one of the at least two zones, and modifying coordinates of each of the plurality of features in response to the correction for the zone in which each feature is mapped. Selectively establishing opaque areas includes selectively depositing opaque material on a portion of a support, as well as depositing a layer of opaque material on a support and selectively removing portions of that layer.

In another embodiment, the invention provides a computer program for correcting pattern features for overlay error based on the overlay error values across the field of exposure. In a further embodiment, the invention provides a machine readable medium having instructions stored thereon for correction of pattern features for overlay error based on the overlay error values across the field of exposure. In a still further embodiment, the invention provides a system for correcting pattern features for overlay error based on the overlay error values across the field of exposure, wherein the system has such a machine readable medium.

The invention further includes methods of varying scope, apparatus produced by the methods, and systems useful in performing the methods.

DETAILED DESCRIPTION OF THE INVENTION

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and their equivalents.

Figure 1:
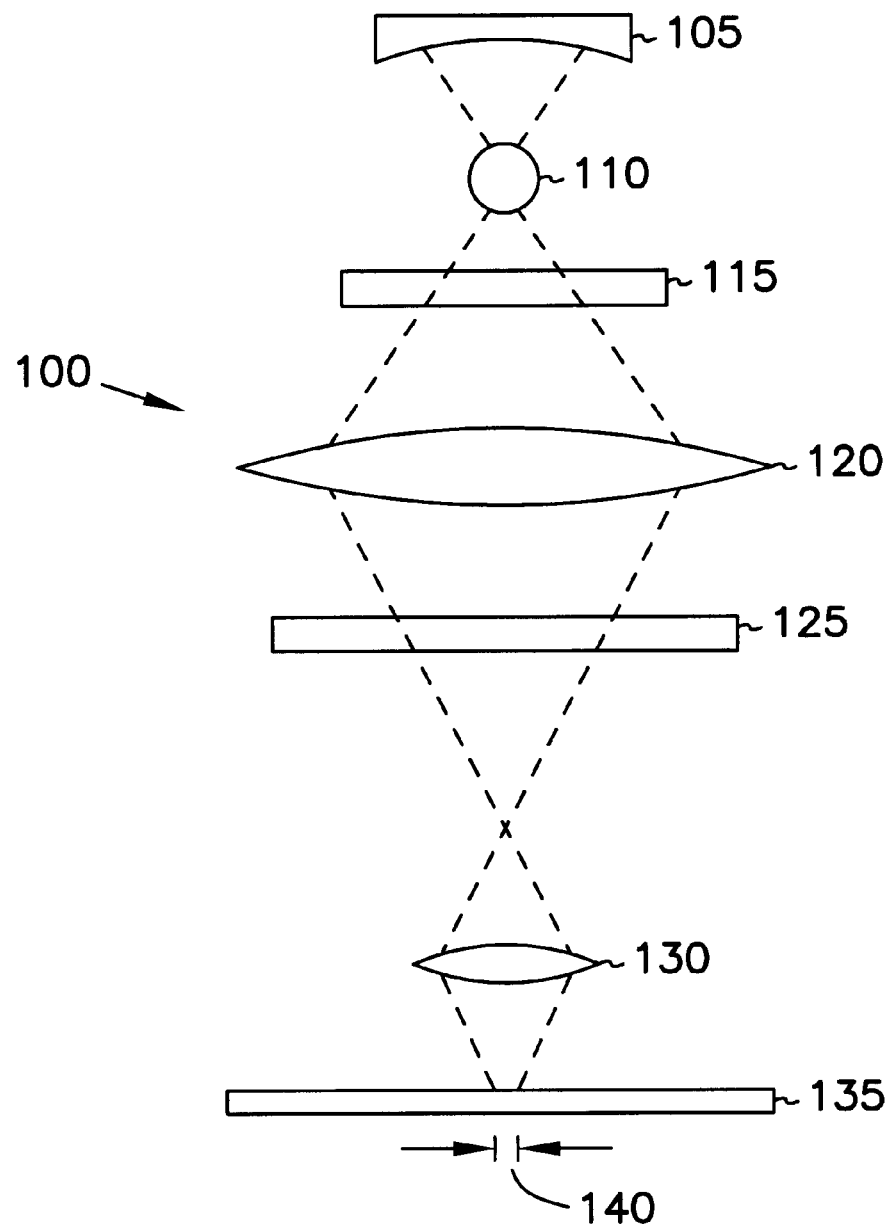
FIG. 1 is a schematic of a photolithography projection system.

FIG. 1 depicts a typical photolithography projection system or lithography system 100. The type depicted is commonly referred to as a step and repeat reduction system. In this type of system, the target 135 is moved incrementally, or stepped, after each exposure to transfer the pattern of the mask 125 to a previously unexposed portion of the target 135. The process is repeated until the pattern of the mask 125 has been transferred to all desired portions of the target 135, thus, step and repeat. The portion exposed during each period of exposure is referred to herein as the field of exposure 140. The lithography system 100 is termed a reduction system because the pattern within the field of exposure is smaller than the pattern of the mask. The PAS 5500/300C deep UV lithography system available from ASML U.S.A., Tempe, Ariz., USA, is an example of one such system.

Lithography system 100 further contains an energy source 110, a mirror 105, a filter 115, a condensing lens 120 and a reduction lens 130. Those skilled in the art will recognize that condensing lens 120 and reduction lens 130 may each represent a series of lenses. Those skilled in the art will further recognize that other arrangements of energy sources and optics systems are suitable for directing energy through the mask 125 to produce an image on target 135.

In lithography system 100, energy from energy source 110 is passed through filter 115, either directly or upon reflection from mirror 105. Filter 115 is used to reduce the energy variation from energy source 110. This is desirable where the resist is more selective to a specific energy level, or to improve resolution through the use of higher energy levels. For example, in the case where energy source 110 is a mercury (Hg) light source, the filter may seek to remove all but the G (436 nm), H (405 nm) or I (365 nm) peaks from the Hg spectrum for use with resists selective to those wavelengths. The filter 115 may alternatively be used to pass higher-energy wavelengths such as the mid and deep ultraviolet peaks found at 313 nm and 254 nm, respectively, in the Hg spectrum, provided the resist is responsive to such energy levels.

Condenser lens 120 concentrates the energy from energy source 110 onto mask 125. The energy passing through mask 125 is then redirected onto target 135 through reduction lens 130. Reduction lens focuses the energy onto target 135 so as to reproduce the pattern of mask 125 onto target 135. In the case of semiconductor processing, the energy focused onto target 135 causes a reaction in the resist on the surface of target 135 to define the pattern of one layer of an integrated circuit. Further processing in the completion of an integrated circuit proceeds in a manner well known in the art.

As previously discussed, due to offset, the pattern transferred to target 135 from the pattern on mask 125 may not align correctly with a pattern on target 135 of a previous or subsequent layer. This misalignment is termed overlay error. Translation, rotation and magnification have been used to minimize overlay error. Despite such corrections for overlay error, features will still experience offset. This residual offset may be unacceptable as feature dimensions continue to decrease.

The various embodiments correct a pattern on a mask to compensate for overlay error. The correction will generally be applied to the mask associated with the larger field. However, where the two pattern layers are created using one exposure of each mask, even where each mask is associated with a different field size, correction can be applied to either mask. It will be apparent that where the mask associated with the smaller field is used for multiple exposures within the field of the other mask, correction of the mask associated with the larger field is the more appropriate choice. Further, it would be generally inefficient to apply the correction to both masks, and such correction can introduce additional errors.

Figure 2:
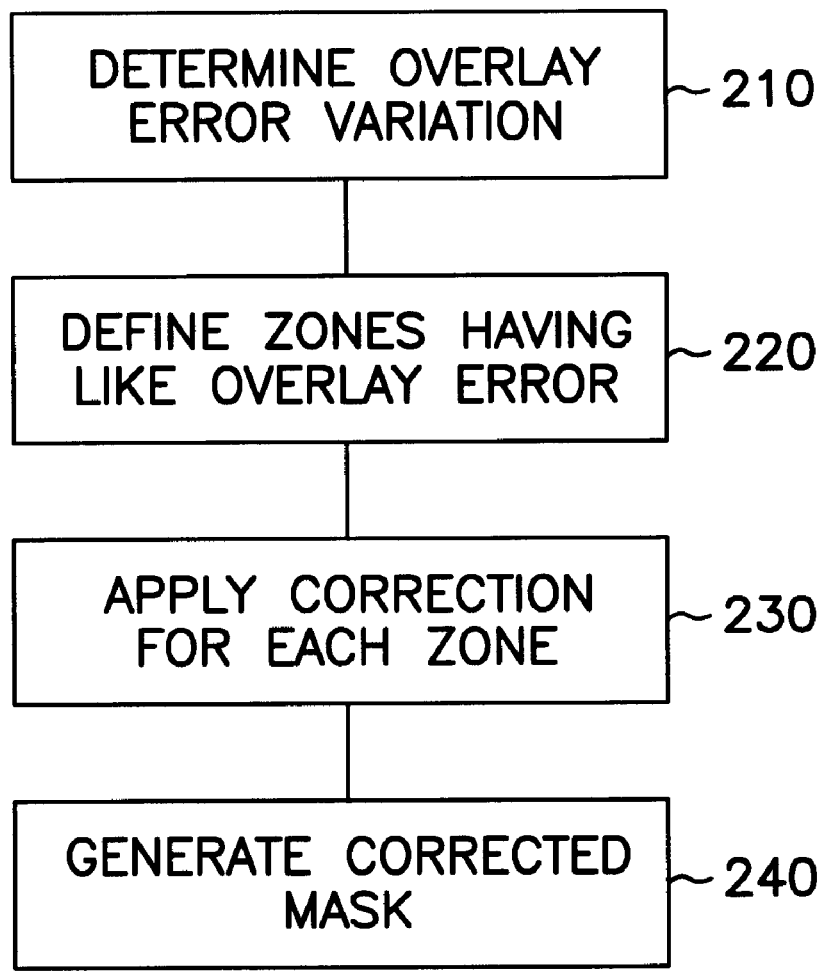
FIG. 2 is a high-level flowchart depicting one embodiment of a method of the invention.

FIG. 2 is a flowchart for an overlay error correction method of one embodiment. FIG. 2 depicts action boxes 210, 220, 230, and 240. In action box 210, the overlay error variation across the field of exposure is determined. One way to accomplish this determination is to produce a mask having a test pattern, such as a regular array of equally-spaced alignment markers, for each lithography system. While the masks may have a different field sizes, the size and spacing of the alignment markers should be substantially the same for each mask.

Figure 3A:
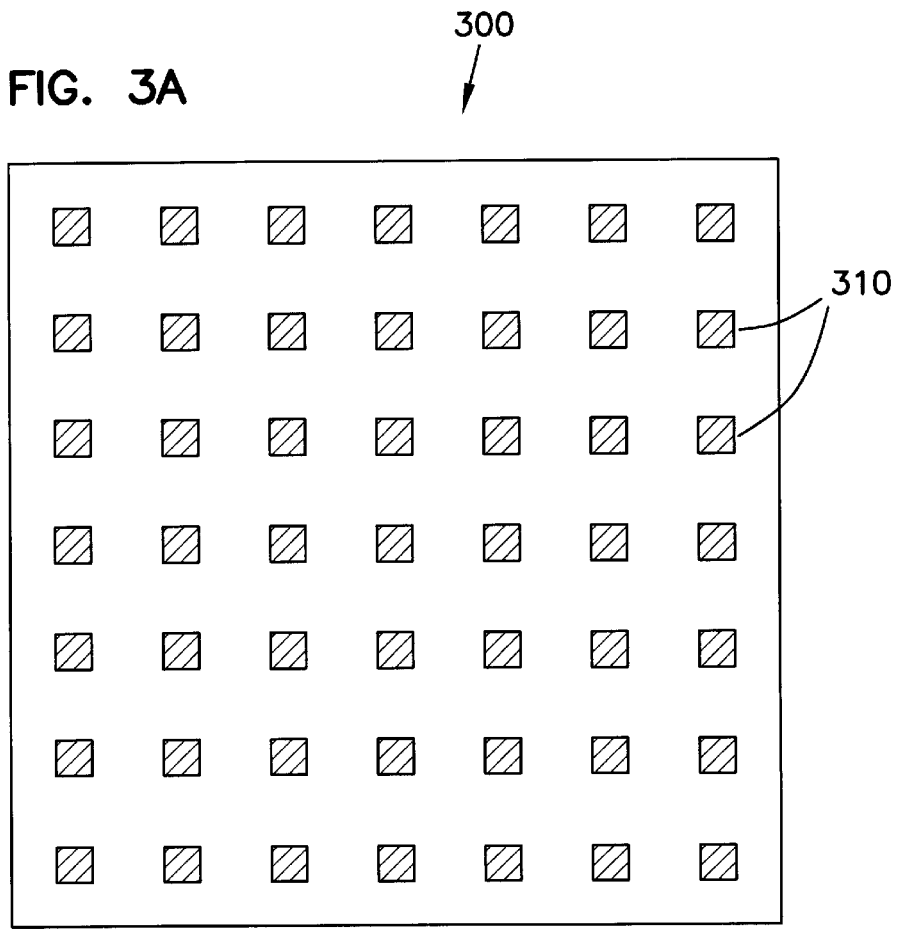
FIG. 3A is an elevation view of an exemplary test pattern.

An example of one suitable test pattern is shown in FIG. 3A as an array 300 of equally-spaced alignment markers 310. By exposing the same photoresist layer with each mask on its respective lithography system to produce a series of alignment marks on the target, and recording the positions of the alignment marks for each exposure, the offset between two corresponding alignment marks defines the overlay error value at that portion of the field. The alignment marks are corresponding when each mark would have the same absolute position on the target but for offset due to the distortion fingerprints of each lithography system.

The procedure is generally carried out by exposing a first pattern of alignment marks using the lithography system with the larger field, then exposing a second pattern of alignment marks using the lithography system having the smaller field. However, this order is not required. The two patterns may be composed of one exposure for each lithography system, or the two patterns may be composed of one exposure for the lithography system having the larger field and multiple exposures for the lithography system having the smaller field, e.g., one exposure in each of four quadrants of the larger field. This method of determining overlay error is well known in the art.

Figure 3B:
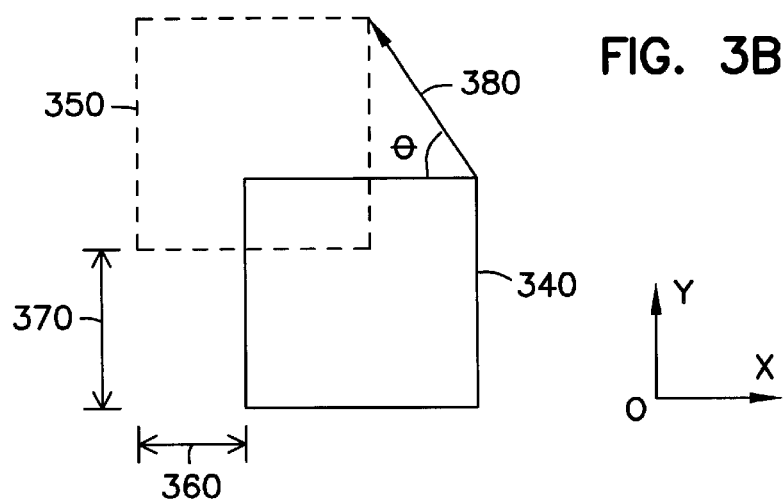
FIG. 3B is a schematic of the components of overlay error.

The overlay error value determined in box 210 may be expressed in more than one coordinate system. With reference to FIG. 3B, the overlay error value between a first alignment mark 340 in a first pattern and its corresponding second alignment mark 350 in a second pattern may have an x component 360 and a y component 370 in a rectangular or Cartesian coordinate system. Alternatively, the overlay error value may be represented as a vector 380 having a magnitude and an angle θ in a polar coordinate system.

Zones having substantially similar overlay error values are defined in action box 220. In one embodiment, zones may be defined as continuous portions of the field containing overlay error values varying about some nominal overlay error value by some allowable variation. In this embodiment, a zone may be defined in a polar coordinate system as a continuous portion of the field containing overlay error values of magnitude n±5% at angle θ±5%, e.g., overlay error values of magnitude 38 nm to 42 nm (40 nm ±5%) at angles of 57° to 63° (60°±5%). Alternatively, a zone may be defined in a Cartesian coordinate system as a continuous portion of the field containing overlay error values having an x component of $n_1$±5% and a y component of $n_2$±5%, e.g., overlay error values having an x component of −19 nm to −21 nm (−20 nm±5%) and a y component of 28.5 nm to 31.5 nm (30 nm±5%). In another embodiment, the allowable variation is expressed in absolute terms, e.g., 40 nm±5 nm. The allowable variations in the foregoing embodiments of ±5% and ±5 nm are for example only. Other percentage or absolute values of allowable variation are acceptable. In addition, the allowable variation need not be evenly spaced about the nominal overlay error value.

It will be apparent that zones having smaller or larger ranges of allowable variation are completely within the scope of the invention. While choosing smaller ranges of allowable variation will result in better overlay error correction, it will also result in a larger number of zones and a corresponding increase in the computation required to generate the corrected pattern.

Other methods of defining zones of substantially similar overlay error values may also be used, such as defining absolute ranges, e.g., 0–5, 5–10, 10–15, etc., in units of length or direction as might be appropriate for the particular range. However, these additional methods may also be expressed as an overlay error varying about some nominal overlay error value by some allowable variation. In the immediately preceding example, the equal absolute ranges may be expressed as 2.5±2.5, 7.5±2.5, 12.5±2.5, etc. As might be apparent from the previous discussion, the ranges may overlap. Alternatively, the ranges may be exclusive, e.g., 0–5, 6–10, 11–15, etc. In most cases, the nominal overlay error value will be approximated by the average or mean of the particular range. However, the user is free to modify the value of the nominal overlay error. In one example, the nominal overlay error value may be the median on the range. The median is the value halfway through an ordered data set, below and above which there lies an equal number of data values. In another example, the nominal overlay error value may be the mode of the range. The mode is the most frequently occurring value in a set of discrete data. In a further example, the nominal overlay error value may be arbitrarily chosen by the user to be some other point within the range.

For simplicity, the choice of coordinate system expression of the overlay error value will generally mirror the coordinate system in which the mask data is maintained. For example, where the mask data is maintained in a Cartesian coordinate system, calculations are generally simplified where the overlay error value is expressed in Cartesian coordinates as well. However, such expression is not required. The remaining discussion will be in the context of a Cartesian coordinate system. It will be apparent to those skilled in the art that the methods described herein can be adapted to other coordinate systems.

coordinate component. There is no requirement that A and B be equal, but such equality is permissible. Furthermore, there is no requirement that the subranges be identical in span for each component.

Table I shows one example of a matrix of zone definitions where the range of overlay error values in a Cartesian coordinate system is −70 nm to 110 nm in the x component and −30 nm to 70 nm in the y component. The range of overlay error values for the x component has been divided into 6 subranges while the range of overlay error values for the y component has been divided into 5 subranges for a 6×5 matrix of zone definitions. The x component subranges are on the horizontal of Table I while the y component subranges are on the vertical of Table I. To reduce corrections in a portion of the field where there is zero overlay error, the zero value is bracketed within a subrange rather than being defined at or near an endpoint of a subrange.

TABLE I

| Subranges | −70 nm to −41 nm | −40 nm to −11 nm | −10 nm to 19 nm | 20 nm to 49 nm | 50 nm to 79 nm | 80 nm to 110 nm |
|---|---|---|---|---|---|---|
| −30 nm to −9 nm | Zone Definition 1 | Zone Definition 2 | Zone Definition 3 | Zone Definition 4 | Zone Definition 5 | Zone Definition 6 |
| −10 nm to 9 nm | Zone Definition 7 | Zone Definition 8 | Zone Definition 9 | Zone Definition 10 | Zone Definition 11 | Zone Definition 12 |
| 10 nm to 29 nm | Zone Definition 13 | Zone Definition 14 | Zone Definition 15 | Zone Definition 16 | Zone Definition 17 | Zone Definition 18 |
| 30 nm to 49 nm | Zone Definition 19 | Zone Definition 20 | Zone Definition 21 | Zone Definition 22 | Zone Definition 23 | Zone Definition 24 |
| 50 nm to 70 nm | Zone Definition 25 | Zone Definition 26 | Zone Definition 27 | Zone Definition 28 | Zone Definition 29 | Zone Definition 30 |

Figure 4:
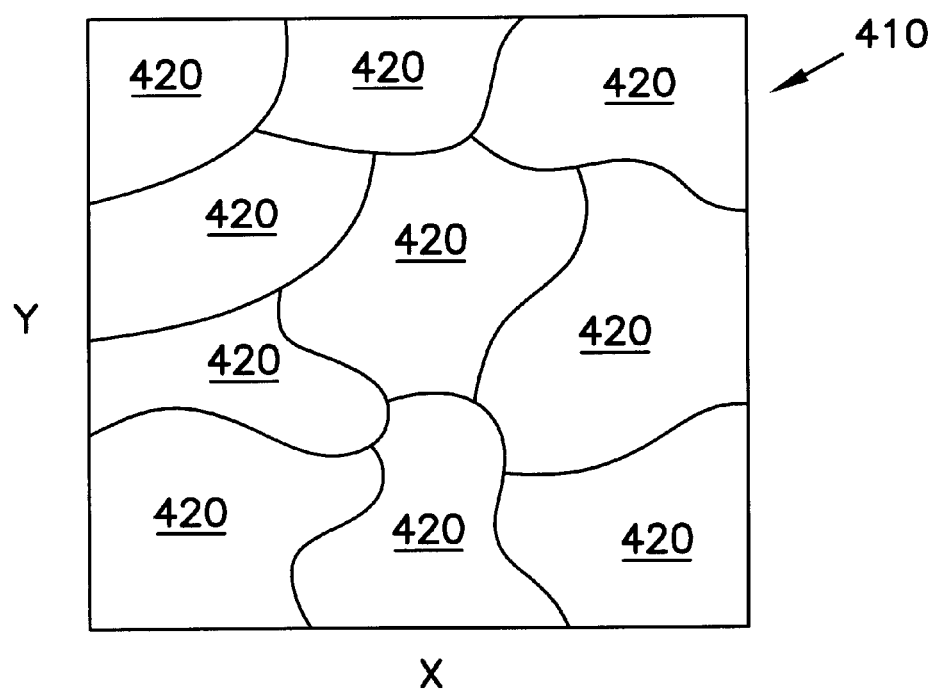
FIG. 4 is a conceptualization of zones defined in a field of exposure for use in the invention.

FIG. 4 depicts a conceptualization of a field of exposure 410 divided into zones 420. Zones 420 are typically identified by their x and y coordinates, allowing features of a mask pattern to be mapped to a specific zone. A feature may be entirely located within one zone, or it may extend across two or more zones. In one embodiment, a feature is mapped to the zone in which it predominately occurs. In another embodiment, a feature is mapped to each zone in which it occurs. The zones 420 are continuous portions of the field 410 having substantially similar overlay error values.

As an alternative to mapping features, the mask pattern can be broken up into cells containing one or more features, or partial features, with the cell being mapped to a zone. While the discussion is generally in the context of applying correction to a feature of a mask, it will be understood that the various embodiments can be equally applied to cells, as both features and cells can be represented mathematically by one or more line segments. Thus, the term feature will be synonymous with cell as used herein.

In one embodiment, zones may be defined by establishing the range of overlay error values within the field for each coordinate component, dividing each range into some set of subranges, and producing an A×B matrix of zone definitions, where A is the number of subranges for the first coordinate component and B is the number of subranges for the second With reference to Table I, continuous portions of the field having overlay error values of 50 nm to 79 nm in the x component and −10 nm to 9 nm in the y component would constitute a zone having zone definition 11. Other zones would be similarly defined.

A given zone definition may apply to more than one continuous portion of the field. Furthermore, some zone definitions may not apply to the field. For example, portions having overlay error values of 20 nm to 49 nm in the x component may not have any overlay error values of 30 nm to 49 nm in the y component. Thus, in the preceding example, zone definition 22 would not apply to any portion of the field.

Other methods of defining zones may be used in addition to those previously described. For example, where changes in overlay error values occur gradually across a field, the field may be divided into a grid, with each section of the grid defining a zone. The nominal overlay error value of each zone, i.e., each section of the grid, is then determined based on the measured overlay error values occurring in that zone. In one embodiment, the nominal overlay error value for each zone is the average of the overlay error values occurring in that zone.

Upon defining zones 420 in action box 220, each pattern feature is corrected for overlay error in action box 230 in accordance with the nominal overlay error value associated with the zone to which the feature is mapped. As such, each feature within a zone will be shifted, or its coordinates modified, by an amount equal to the nominal overlay error value. For example, if a zone is defined as containing overlay error values having an x component of −19 nm to −21 nm (−20 nm±5%) and a y component of 28.5 nm to 31.5 nm (30 nm±5%), features within that zone would have their coordinates shifted by approximately −20 nm in the x direction and approximately 30 nm in the y direction. As a further example, each feature in a zone having zone definition 11 as identified in Table I would have their coordinates shifted by approximately 65 nm in the x direction and approximately 0 nm, i.e., substantially no correction, in the y direction, where the nominal overlay value is approximately the midpoint of each subrange. Thus, in each example, the features are moved by a magnitude and direction substantially equal to the nominal overlay error value for its associated zone.

To obtain the appropriate direction of the overlay error, the offset used to define overlay error is measured from the alignment mark of the lithography system having the mask to be corrected, to its corresponding alignment mark of the lithography system having the mask not being corrected. Referring back to FIG. 3B, where first alignment mark 340 was produced on the lithography system associated with the mask to be corrected, overlay error is measured from first alignment mark 340 to second alignment mark 350 such that the x component has a negative direction and the y component has a positive direction.

Having applied the correction to each feature, a corrected pattern is generated in action box 240 for production of a corrected mask. The corrected mask will produce a decrease in the average overlay error by shifting the features of the corrected mask such that the resulting pattern features on the target will more closely align, on average, with their corresponding features produced by the other mask on the other lithography system in a previous or subsequent layer. It is generally presumed that the performance of an integrated circuit having reduced overlay error will exceed the performance of an integrated circuit having increased overlay error, all other factors being equal. It is further generally presumed that reductions in overlay error of an integrated circuit will result in reduced waste and increased throughput in manufacturing. Another advantage of reduced overlay error is the ability to design circuits with increasingly tight tolerances, thus leading to improved use of resources and accompanying cost reductions.

Models utilizing translation, rotation and magnification to minimize overlay error must make concessions such that improvements in one portion of the field do not result in unacceptable errors in another portion of the field, as the same correction is simultaneously applied to the entire field of a lithography system. Using the various embodiments of the invention, the user is capable of applying correction models for each zone of the field, thus reducing the magnitude of any concessions. By reducing concessions, a more accurate alignment between two patterns is attainable.

Figure 5:
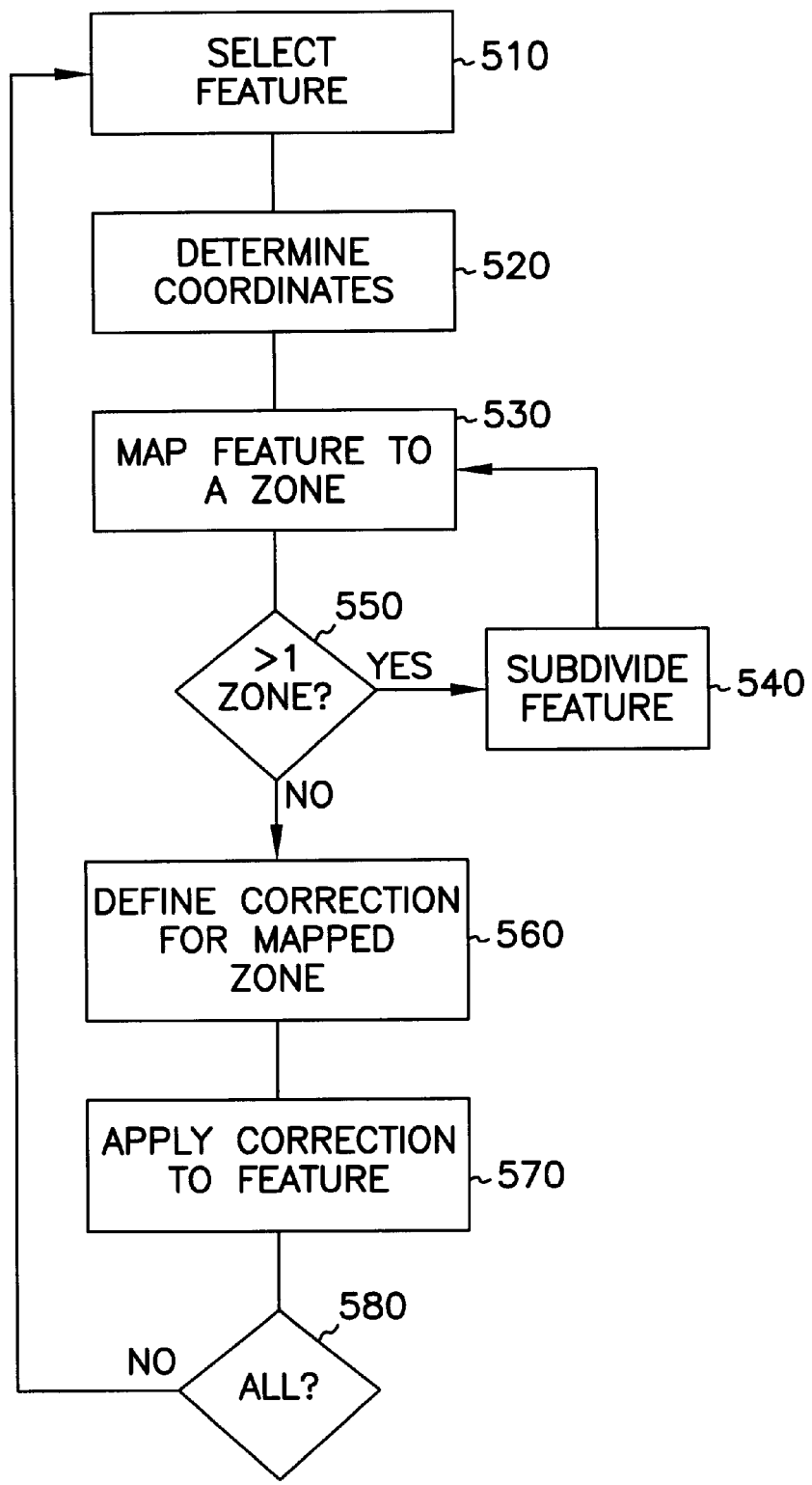
FIG. 5 is a high-level flowchart depicting one subprocess of the method depicted in FIG. 2.

FIG. 5 depicts one embodiment of processing found in action box 230. FIG. 5 includes action boxes 510, 520, 530, 540, 560 and 570, as well as decision boxes 550 and 580. In action box 510, the user selects a feature (or cell) to which correction will be applied. This selection can be manual or through an automated routine. Once a feature is selected, action box 520 determines the coordinates of the feature. The coordinates define its position within an image pattern, and thus its position within the field of exposure. While it is conceivable that a user could manually enter coordinates, such coordinates are typically contained in a database defining all dimensional characteristics of the image pattern. A more practicable approach would then be to extract or import the desired data from the database.

Having determined the coordinates of the feature, these coordinates are used in action box 530 to map the feature into a zone of the field of exposure. It is virtually certain that some features will map into more than one zone. Decision box 550 directs control based on whether a feature is entirely contained within one zone, or extends across more than one zone. If the feature extends across more than one zone, the feature can be subdivided in action box 540 such that only that portion of the feature contained entirely within one zone is considered for correction based on that zone's model. Alternatively, a feature extending across more than one zone can be "mapped" entirely to one zone based on criteria chosen by the user, e.g., mapping the feature to the zone which contains the largest or most critical portion of the feature. In this case, it is the mapped zone that will be used for determination of the correction applied, regardless of the other zones encompassing a portion of the feature.

The correction for the mapped zone is defined in action box 560 according to the nominal overlay error value associated with the mapped zone. The correction is applied to the feature in action box 570. The resultant is corrected coordinates that modify the location of the original feature on the mask to obtain a more accurate alignment of the desired image on the target. Decision box 580 is used to determine if any uncorrected features remain, directing control back to action box 510 if any so exist.

It should be apparent that where features extend across two or more zones, applying corrections in each zone will inherently produce a "stair-step" result along the feature, due to a different correction being applied upon crossing the interface between zones. Despite this inherency, it is expected that the overall reduction in overlay error will outweigh the stair-step effect. Furthermore, if the stair-step effect is considered undesirable, further corrections can be applied to smooth or blend the feature coordinates where the feature extends across a zone interface.

Figure 6:
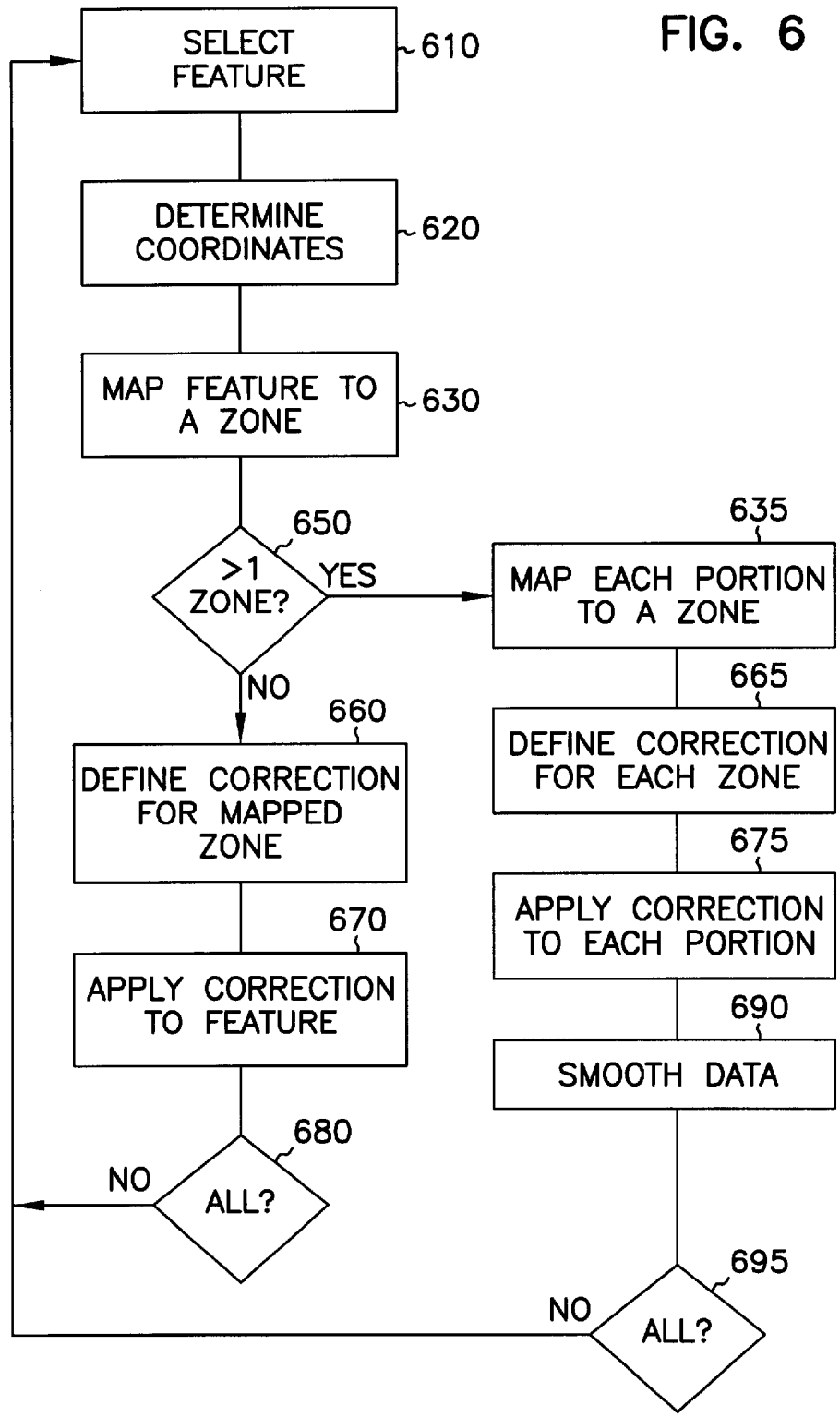
FIG. 6 is a high-level flowchart depicting an alternate subprocess of the method depicted in FIG. 2.

FIG. 6 depicts an alternate handling method where features extend across more than one zone. FIG. 6 includes action boxes 610, 620, 630, 635, 660, 665, 670, 675 and 690, as well as decision boxes 650, 680 and 695. Similar to the processing shown in FIG. 5, a feature is selected in action box 610, coordinates are determined in action box 620 and the feature is mapped in action box 630. Upon deciding if the feature extends across a zone interface, decision box 650 redirects control accordingly. If the feature is entirely contained in one zone, processing proceeds similar to the processing of FIG. 5, that is, a correction is defined in action box 660 and the correction is applied in action box 670. If the feature resides in more than one zone, control is directed to action box 635 where the feature is mapped into multiple zones. Correction is defined for each zone to which the feature is mapped in action box 665. The correction is applied to each portion of the feature in action box 675 based on the correction for the zone in which that portion of the feature resides. The resulting feature coordinates are then further corrected in action box 690 to blend the inherent stair-step effect. Action box 690 may represent a least-squares fit of the resulting data, a first order filter or other method known to smooth data.

As recognized by those skilled in the art, semiconductor fabrication utilizes lithographic techniques in producing integrated circuits. An integrated circuit contains a variety of semiconductor devices resulting from a repeated process of applying layers to a substrate, masking those layers and patterning those layers. The integrated circuit is supported by a substrate. A substrate is often a silicon wafer, but can additionally refer to silicon-on-insulator (SOI) technology, silicon-on-sapphire (SOS) technology, thin film transistor (TFT) technology and other applicable support structures. The integrated circuits are typically repeated multiple times on each substrate. The substrate is further processed to separate the integrated circuits into dies as is well known in the art.

Figure 7:
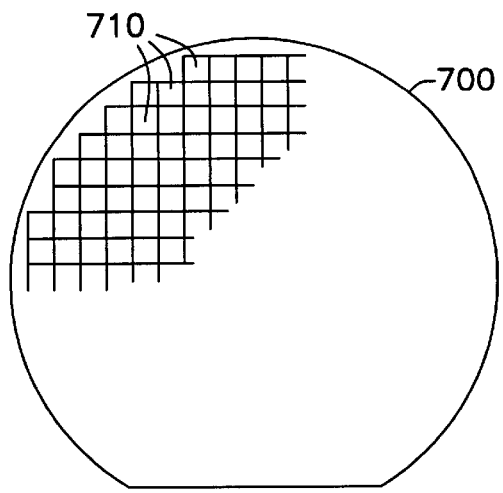
FIG. 7 is an elevation view of a substrate containing semiconductor dies.

With reference to FIG. 7, in one embodiment, a semiconductor die 710 is produced from a substrate 700. A die is an individual pattern, typically rectangular, on a substrate that contains circuitry to perform a specific function. A substrate will typically contain a repeated pattern of such dies containing the same functionality. Die 710 may contain circuitry, for example, of a memory device having an array of memory cells and access circuitry. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control. A die so packaged is commonly referred to as an integrated circuit chip. Die 710 is produced using photolithographic techniques as described herein using at least one mask corrected in accordance with the methods of the invention.

Figure 8:
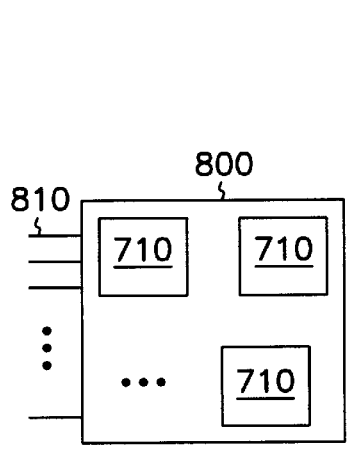
FIG. 8 is a block diagram of an exemplary circuit module.

As shown in FIG. 8, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. Some examples of a circuit module include memory modules, device drivers, power modules, communication modems, processor modules and application-specific modules and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom providing unilateral or bilateral communication and control.

Figure 9:
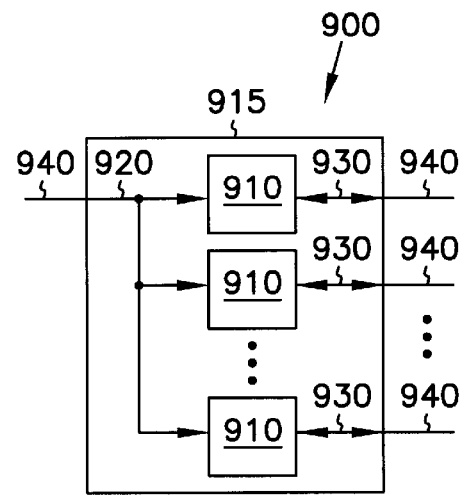
FIG. 9 is a block diagram of an exemplary memory module.

FIG. 9 shows one embodiment of a circuit module as memory module 900. Memory module 900 generally depicts a Single Inline Memory Module (SIMM) or Dual Inline Memory Module (DIMM). A SIMM or DIMM is generally a printed circuit board (PCB) or other support containing a series of memory devices. While a SIMM will have a single in-line set of contacts or leads, a DIMM will have a set of leads on each side of the support with each set representing separate I/O signals. Memory module 900 contains multiple memory devices 910 contained on support 915, the number depending upon the desired bus width and the desire for parity. Memory module 900 may contain memory devices 910 on both sides of support 915. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 9.

Figure 10:
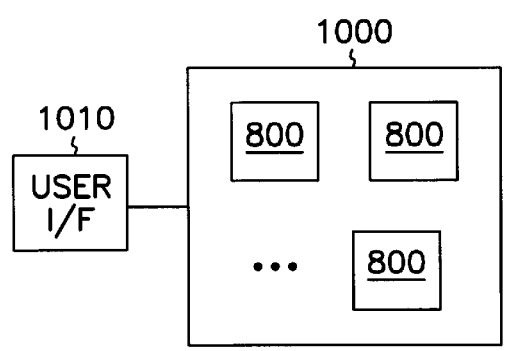
FIG. 10 is a block diagram of an exemplary electronic system.

FIG. 10 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system.

Figure 11:
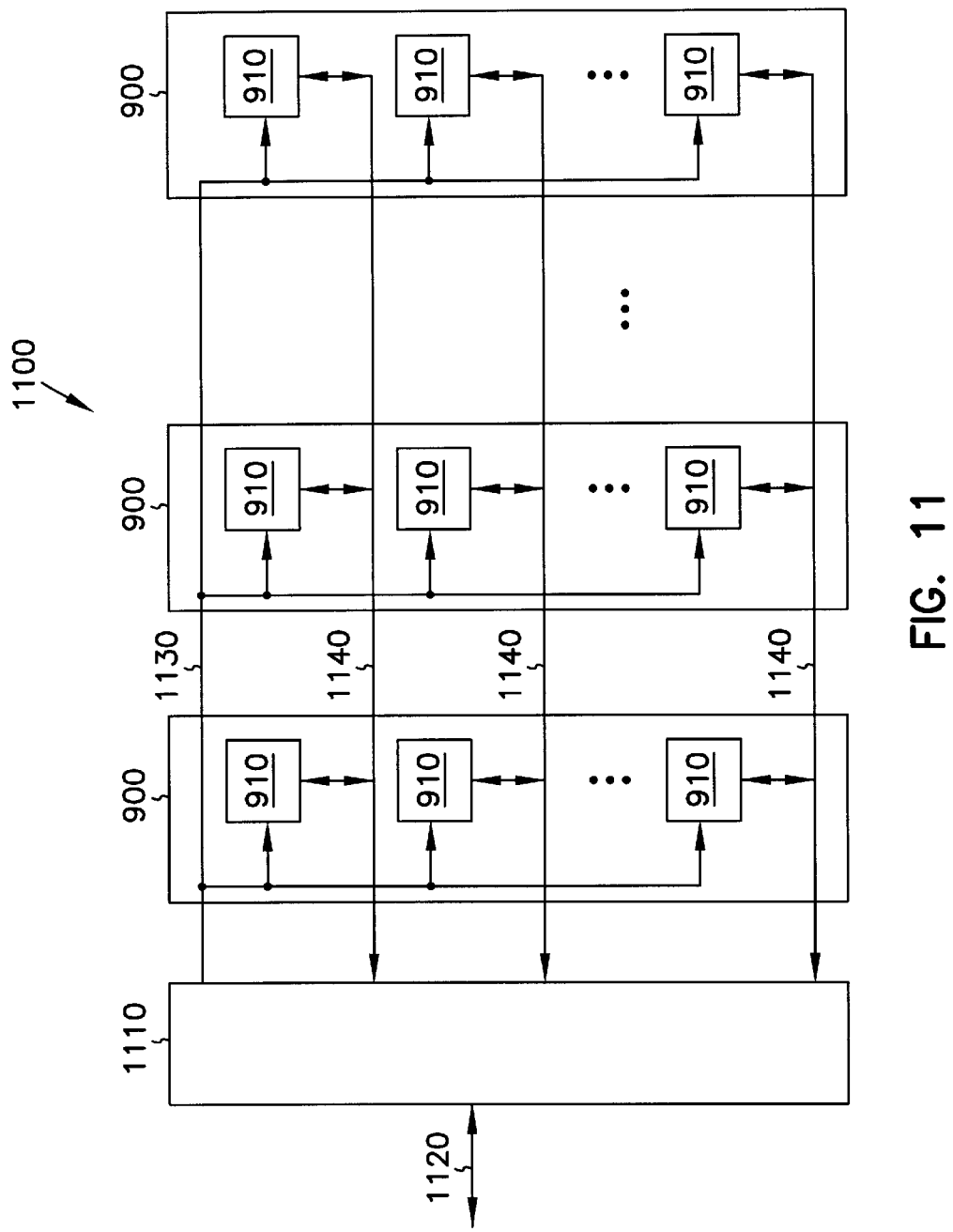
FIG. 11 is a block diagram of an exemplary memory system.

FIG. 11 shows one embodiment of an electronic system as memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 12:
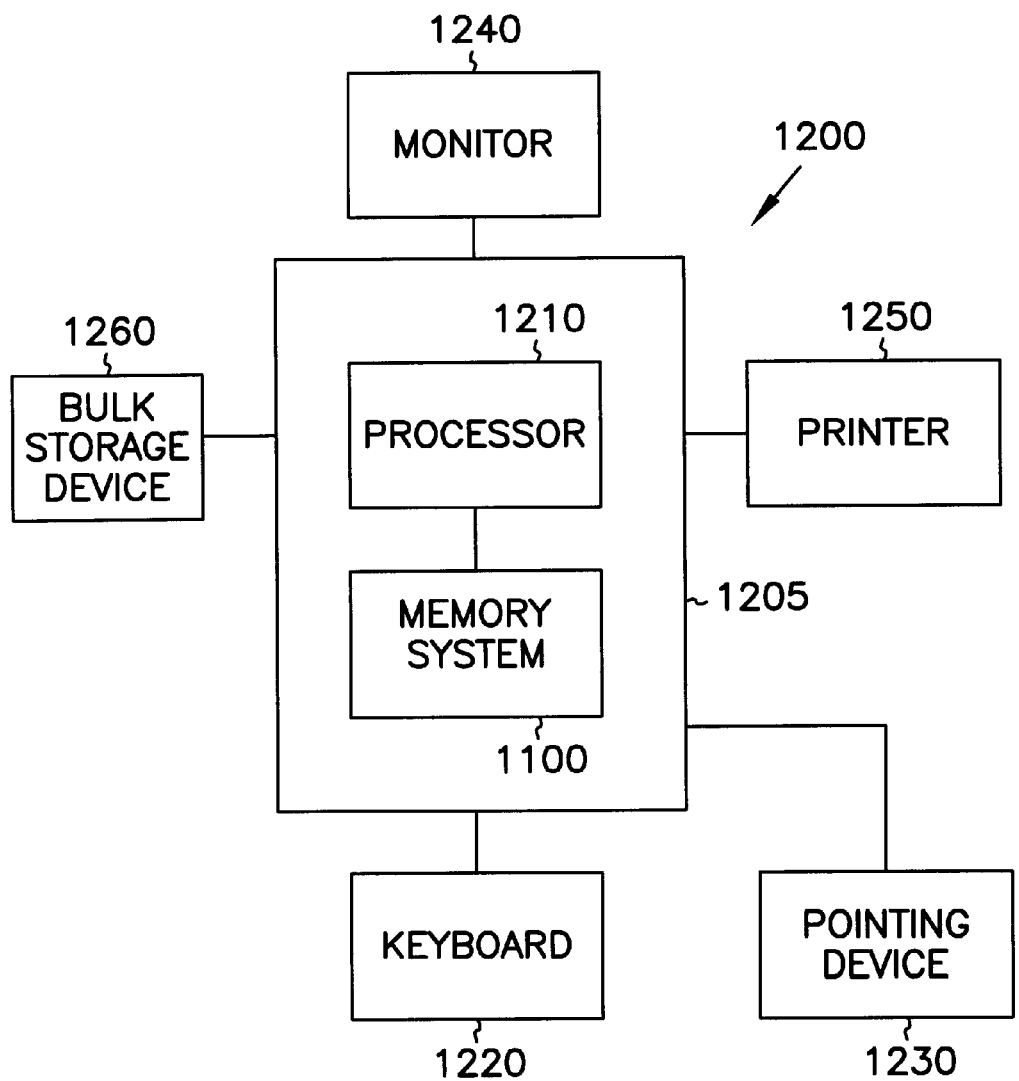
FIG. 12 is a block diagram of an exemplary computer system.

FIG. 12 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e. memory system 1100, as a subcomponent. Computer system 1200 optionally contains user interface components. Depicted in FIG. 12 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit.

Systems similar to computer system 1200 may be used for correcting masks in accordance with the invention. Instructions for performing methods of various embodiments of the invention, such as those depicted in FIGS. 2, 5 and 6, are contained on a machine readable medium, such as memory system 1100 or bulk storage device 1260, and are capable of causing the processor 1210 to apply the correction to the mask pattern. The machine readable medium may be removable from computer system 1200. The instructions may be in the form of a computer program or software capable of causing the processor 1210 to perform the methods of various embodiments of the invention, such as those depicted in FIGS. 2, 5 and 6.

Conclusion

Methods of correcting for overlay error have been described, wherein the methods account for combined offset across the field of exposures of more than one photolithography projection system, or lithography system. The methods may be utilized to produce improved masks for reproducing a desired patterns on a target, often a semiconductor substrate. Furthermore, a system has been described to perform the correction methods. Apparatus produced from masks utilizing the correction methods have further been described.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of the present invention. For example, any number of zones may be defined and any type of lithography system may be used. Therefore, it is manifestly intended that this invention be limited only by the claims and the equivalents thereof.

What is claimed is:

1. A method of producing a physical mask, comprising:
    generating a database representation of the mask;
    correcting the database representation, thereby producing a corrected database representation, wherein correcting the database representation comprises:
        determining overlay error variation across a field of the mask;
        defining at least two zones within the field of the mask, wherein each zone is a continuous portion of the field containing substantially similar overlay error values, and wherein each zone has a nominal overlay error value;
        defining a correction for each of the at least two zones, wherein the correction for each zone is approximately the nominal overlay error value for that zone;
        mapping each of a plurality of features to one of the at least two zones; and
        modifying coordinates of each of the plurality of features in response to the correction for the zone in which each feature is mapped; and
    selectively establishing opaque areas on a clear support in response to the corrected database representation.

2. The method of claim 1, wherein defining at least two zones further comprises defining zones to contain overlay error values within an allowable variation of the nominal overlay error value.

3. The method of claim 1, further comprising defining the nominal overlay error value to be an average overlay error value for its associated zone.

4. The method of claim 1, wherein defining at least two zones further comprises defining each zone to be a section of a grid of the field.

5. The method of claim 1, wherein modifying coordinates comprises modifying a database representation of a physical mask.

6. A method of producing a physical mask, comprising:
    generating a database representation of the mask;
    correcting the database representation, thereby producing a corrected database representation, wherein correcting the database representation comprises:
        determining overlay error variation across a field of the mask;
        defining at least two zones within the field of the mask, wherein each zone is a continuous portion of the field containing substantially similar overlay error values, and wherein each zone has a nominal overlay error value;
        defining a correction for each of the at least two zones, wherein the correction for each zone is approximately the nominal overlay error value for that zone;
        mapping each portion of each of a plurality of features to one of the at least two zones; and
        modifying coordinates of each portion of each of the plurality of features in response to the correction for the zone in which each portion is mapped; and
    selectively establishing opaque areas on a clear support in response to the corrected database representation.

7. The method of claim 6, wherein defining at least two zones further comprises defining zones to contain overlay error values within an allowable variation of the nominal overlay error value.

8. The method of claim 6, further comprising defining the nominal overlay error value to be an average overlay error value for its associated zone.

9. The method of claim 6, wherein defining at least two zones further comprises defining each zone to be a section of a grid of the field.

10. The method of claim 6, wherein modifying coordinates comprises modifying a database representation of a physical mask.

11. The method of claim 6, further comprising smoothing the coordinates of the feature.

12. A method of producing a physical mask, comprising:
    generating a database representation of the mask;
    correcting the database representation, thereby producing a corrected database representation, wherein correcting the database representation comprises:
        determining overlay error variation across a field of the mask;
        defining at least two zones within the field of the mask, wherein each zone is a section of a grid of the field, and wherein each zone has a nominal overlay error value;
        defining a correction for each of the at least two zones, wherein the correction for each zone is approximately the nominal overlay error value for that zone;
        mapping each of a plurality of features to one of the at least two zones; and
        modifying coordinates of each of the plurality of features in response to the correction for the zone in which each feature is mapped; and
    selectively establishing opaque areas on a clear support in response to the corrected database representation.

13. The method of claim 12, wherein defining at least two zones further comprises defining zones to contain overlay error values within an allowable variation of the nominal overlay error value.

14. The method of claim 12, further comprising defining the nominal overlay error value to be an average overlay error value for its associated zone.

15. The method of claim 12, wherein modifying coordinates comprises modifying a database representation of a physical mask.

16. A method of producing a physical mask, comprising:
    generating a database representation of the mask;
    correcting the database representation, thereby producing a corrected database representation, wherein correcting the database representation comprises:
        determining overlay error variation across a field of the mask;
        defining at least two zones within the field of the mask, wherein each zone is a section of a grid of the field, and wherein each zone has a nominal overlay error value;

defining a correction for each of the at least two zones, wherein the correction for each zone is approximately the nominal overlay error value for that zone;

mapping each portion of each of a plurality of features to one of the at least two zones; and modifying coordinates of each portion of each of the plurality of features in response to the correction for the zone in which each portion is mapped; and selectively establishing opaque areas on a clear support in response to the corrected database representation.

17. The method of claim 16, wherein defining at least two zones further comprises defining zones to contain overlay error values within an allowable variation of the nominal overlay error value.

18. The method of claim 16, further comprising defining the nominal overlay error value to be an average overlay error value for its associated zone.

19. The method of claim 16, wherein modifying coordinates comprises modifying a database representation of a physical mask.

20. The method of claim 16, further comprising smoothing the coordinates of the feature.

21. A method of producing a physical mask, comprising:

generating a database representation of the mask;

correcting the database representation, thereby producing a corrected database representation, wherein correcting the database representation comprises:

determining overlay error variation across a field of the mask by measuring overlay error values at a plurality of locations within the field;

defining at least two zones within the field of the mask, wherein each zone is a continuous portion of the plurality of locations within the field containing substantially similar overlay error values, and wherein each zone has a nominal overlay error value;

defining a correction for each of the at least two zones, wherein the correction for each zone is approximately the nominal overlay error value for that zone;

mapping a feature of the mask to one of the at least two zones; and modifying coordinates of the feature in response to the correction for a zone to which the feature is mapped.

22. The method of claim 21, wherein defining at least two zones further comprises defining zones to contain overlay error values within an allowable variation of the nominal overlay error value.

23. The method of claim 21, further comprising defining the nominal overlay error value to be an average overlay error value for its associated zone.

24. The method of claim 21, wherein defining at least two zones further comprises defining each zone to be a section of a grid of the field.

25. The method of claim 21, wherein modifying coordinates comprises modifying a database representation of a physical mask.

26. A mask, comprising:

a clear support;

at least one opaque area on the support; and at least one clear area on the support;

wherein the mask is produced by a method comprising:

determining overlay error variation across a field of the mask;

defining at least two zones within the field of the mask, wherein each zone is a continuous portion of the field containing substantially similar overlay error values, and wherein each zone has a nominal overlay error value;

defining a correction for each of the at least two zones, wherein the correction for each zone is approximately the nominal overlay error value for that zone;

mapping each of a plurality of features to one of the at least two zones; and modifying coordinates of each of the plurality of features in response to the correction for the zone in which each feature is mapped.

27. The mask of claim 26, wherein defining at least two zones further comprises defining zones to contain overlay error values within an allowable variation of the nominal overlay error value.

28. The mask of claim 26, further comprising defining the nominal overlay error value to be an average overlay error value for its associated zone.

29. The mask of claim 26, wherein defining at least two zones further comprises defining each zone to be a section of a grid of the field.

30. The mask of claim 26, wherein modifying coordinates comprises modifying a database representation of a physical mask.

31. A mask, comprising:

a clear support;

at least one opaque area on the support; and at least one clear area on the support;

wherein the mask is produced by a method comprising:

determining overlay error variation across a field of the mask;

defining at least two zones within the field of the mask, wherein each zone is a continuous portion of the field containing substantially similar overlay error values, and wherein each zone has a nominal overlay error value;

defining a correction for each of the at least two zones, wherein the correction for each zone is approximately the nominal overlay error value for that zone;

mapping each portion of each of a plurality of features to one of the at least two zones; and modifying coordinates of each portion of each of the plurality of features in response to the correction for the zone in which each portion is mapped.

32. The mask of claim 31, wherein defining at least two zones further comprises defining zones to contain overlay error values within an allowable variation of the nominal overlay error value.

33. The mask of claim 31, further comprising defining the nominal overlay error value to be an average overlay error value for its associated zone.

34. The mask of claim 31, wherein defining at least two zones further comprises defining each zone to be a section of a grid of the field.

35. The mask of claim 31, wherein modifying coordinates comprises modifying a database representation of a physical mask.

36. The mask of claim 31, further comprising smoothing the coordinates of the feature.

37. A mask, comprising:

a clear support;

at least one opaque area on the support; and at least one clear area on the support;

wherein the mask is produced by a method comprising:

determining overlay error variation across a field of the mask by measuring overlay error values at a plurality of locations within the field;

defining at least two zones within the field of the mask, wherein each zone is a continuous portion of the plurality of locations within the field containing substantially similar overlay error values, and wherein each zone has a nominal overlay error value;

defining a correction for each of the at least two zones, wherein the correction for each zone is approximately the nominal overlay error value for that zone;

mapping a feature of the mask to one of the at least two zones; and modifying coordinates of the feature in response to the correction for a zone to which the feature is mapped.

38. The mask of claim 37, wherein defining at least two zones further comprises defining zones to contain overlay error values within an allowable variation of the nominal overlay error value.

39. The mask of claim 37, further comprising defining the nominal overlay error value to be an average overlay error value for its associated zone.

40. The mask of claim 37, wherein defining at least two zones further comprises defining each zone to be a section of a grid of the field.

41. The mask of claim 37, wherein modifying coordinates comprises modifying a database representation of a physical mask.

* * * * *